United States Patent

[11] 3,600,642

[72] Inventors David F. Allison
Los Altos;
Lewis K. Russell, Livermore, both of, Calif.

[21] Appl. No. 776,069
[22] Filed Nov. 15, 1968
[45] Patented Aug. 17, 1971

[54] MOS STRUCTURE WITH PRECISELY CONTROLLED CHANNEL LENGTH AND METHOD
2 Claims, 10 Drawing Figs.

[52] U.S. Cl. .......... 317/235, 148/186, 148/175
[51] Int. Cl. .......... H01l 11/00, H01c 7/14
[50] Field of Search .......... 317/235

[56] References Cited

UNITED STATES PATENTS

| | | | |
|---|---|---|---|
| 3,243,669 | 3/1966 | Sah .......... | 317/235 |
| 3,440,500 | 4/1969 | Coppen .......... | 317/235 |
| 3,456,168 | 7/1969 | Tatom .......... | 317/235 |

FOREIGN PATENTS

| | | | |
|---|---|---|---|
| 1,045,429 | 10/1966 | Great Britain .......... | 317/235 |

*Primary Examiner*—Jerry D. Craig
*Attorney*—Flehr, Hohbach, Test, Albritton & Herbert

ABSTRACT: MOS structure with precisely controlled channel length and method for making the same by utilization of the same mask for making the channel.

PATENTED AUG 17 1971 3,600,642

INVENTOR.
David F. Allison
Lewis Keith Russell
BY Flehr, Hohbach, Test, Albritton & Herbert
Attorneys

MOS STRUCTURE WITH PRECISELY CONTROLLED CHANNEL LENGTH AND METHOD

BACKGROUND OF THE INVENTION

In conventional MOS transistors it is quite difficult to define precisely and control the very small channel length of a transistor because the diffusion is normally accomplished between two separate beds separated by a finite distance with resolution being determined by photoresist techniques and the length being controlled by the lateral diffusion and the line definition which can be accomplished with such photoresist techniques. Utilizing such procedures, it has been difficult to achieve a channel length within ± 1 micron. There is, therefore, a need for a new and improved MOS semiconductor structure and method in which the channel length can be more precisely controlled.

SUMMARY OF THE INVENTION AND OBJECTS

The MOS structure with precisely controlled channel length comprises a semiconductor body with a surface. The body has a channel of precise length formed therein by first and second junctions extending to the surface with one junction disposed in the other. Gate, source and drain contacts are carried by the body with the gate contact overlying the portion of the channel which extends to the surface. In the method, both junctions are formed through the same mask.

In general, it is an object of the present invention to provide an MOS semiconductor structure which has a precisely controlled channel length.

Another object of the invention is to provide a semiconductor structure of the above character which can be readily and economically manufactured.

Another object of the invention is to provide a method for manufacturing an MOS semiconductor structure having a precisely controlled channel length which utilizes the same mask for forming both junctions which define the channel length.

Additional objects and features of the invention will appear from the following description in which the preferred embodiments are set forth in detail in conjunction with the accompanying drawings.

DESCRIPTION OF THE PREFERRED EMBODIMENT

Figure 1:
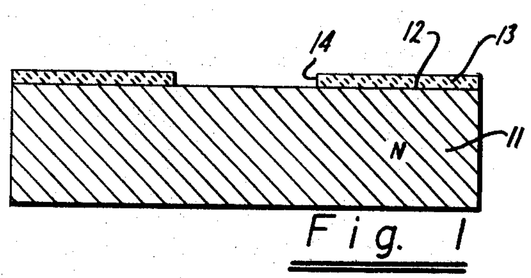
FIGS. 1—4 are cross-sectional views showing the processing steps for making a semiconductor structure incorporating the present invention.

In fabricating an MOS structure with a precisely controlled channel length in accordance with the present invention, a semiconductor body 11 is used. Typically, the semiconductor body 11 can be formed of monocrystalline silicon and can be either doped or undoped. If it is undoped, then at least a portion of the semiconductor body is doped with the desired impurity. Let it be assumed that a doped type of semiconductor material is utilized and that it is doped with an N-type impurity as shown in FIG. 1. Let it also be assumed that the body 11 is provided with at least one planar surface 12 which is suitable for the formation of semiconductor devices therein utilizing a planar technology.

Figure 2:
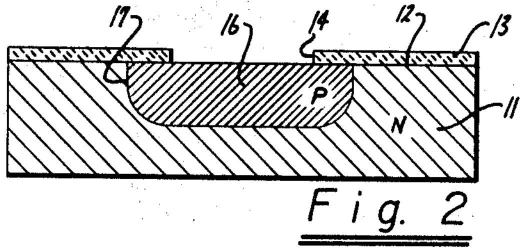

The semiconductor body 11 is then taken and placed in a suitable oxidizing atmosphere so that a layer 13 of silicon dioxide is at least formed on the surface 12 to a sufficient thickness so that it can serve as a mask as hereinafter described. After the silicon dioxide layer 13, which is an insulating layer, has been formed, a mask (not shown) of a suitable material such as photoresist is placed on the outer surface of the layer 13 in a predetermined pattern to permit an opening 14 to be formed in the silicon dioxide layer. After the mask is in place, the silicon dioxide 13 is subjected to an etch so that the opening 14 is formed in the oxide which extends down to the semiconductor body 11. A P-type bed 16 is then formed in the semiconductor body 11 by diffusing a P-type dopant through the hole 14 in a manner well known to those skilled in the art to form a junction 17. The conductivity of the semiconductor body 11 is of one type, whereas the region 16 has a conductivity of an opposite type to form the junction 17 which is generally dish-shaped as shown in FIG. 2 and which extends to the surface 12.

During the step in which the region 16 is being formed, a very thin layer of oxide may grow in the opening 14. Before the channel is formed as hereinafter described, this very thin layer of silicon dioxide is removed by dipping the semiconductor body in an etch for a short period of time. Since this layer of silicon dioxide in the opening 14 is relatively thin, it will be removed quite rapidly without appreciably affecting the thickness of the silicon dioxide 13 or the inner margins of the same which define the opening 14 through which the region 16 had been formed.

Figure 3:
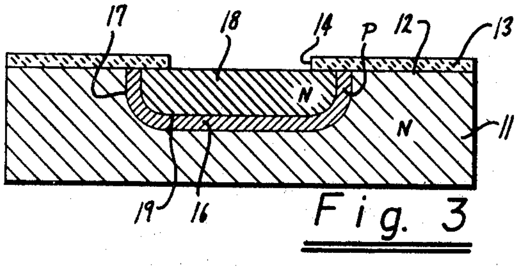

An impurity opposite to that which had been diffused through the opening 14 is now diffused through the same opening 14 to provide a region 18 within the region 16 to a precisely controlled depth to form a junction 19 which is also dish-shaped and which is spaced a predetermined distance from the junction 17 and also extends to the planar surface 12. Thus, it can be seen by utilizing the same opening 14, an impurity of one conductivity type is diffused to a predetermined junction depth and thereafter through the same hole 14, another impurity of opposite conductivity type and of higher concentration is diffused through the same hole to a predetermined depth whereby the channel length between the source and the drain is determined by the precise spacing between the junctions 17 and 19 as shown in FIG. 3. This spacing between the junctions 17 and 19 can be very precisely controlled, i.e., within a few tenths of a micron, to provide an MOS structure which has a precisely controlled channel length.

Figure 4:
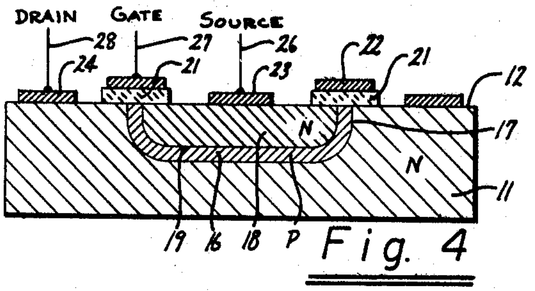

After the steps shown in FIG. 3 have been completed, the entire oxide layer 13 is stripped in a conventional manner such as by placing the semiconductor structure shown in FIG. 3 in an etch. It should be pointed out that it is not absolutely necessary to strip all the oxide except in the gate region in which it is desirable to provide an oxide layer of controlled dimensions, i.e., a very thin oxide, to obtain good gate control. Thereafter, as shown in FIG. 4, an oxide layer 21 of a precise thickness such as approximately 1,000 Angstroms is formed on the surface 12 and then by suitable photolithographic techniques, the undesired oxide is removed in such a manner so that the oxide 21 extends over the portion of the channel which extends to the surface and substantially beyond the portions of the junctions 17 and 19 which extend to the surface as shown in FIG. 4. Metallization of a suitable type, such as aluminum, is then deposited on the surface and etched to provide a contact pad 22 for the gate, a contact pad 23 for the source and a contact pad 24 for the drain and to which are connected leads 26, 27 and 28, respectively. It will be noted that the metallization for the gate has a width which is less than the width of the oxide 21 but still has a width which is greater than the width of the area between the junctions 17 and 19.

Since the diffusion operations which were carried out as shown in FIG. 2 and 3 utilize the same mask which defines the opening 14, it can be seen that the depth of the diffusions has as a reference the same boundary or edge and, therefore, the length of the gate is controlled by the diffusion steps alone. It has been found that it is possible to control this gate length with the same precision that it is now possible to control the base width in bipolar transistor structures. Thus, even with the present state of the art, it should be possible to control the channel length to less than one-half of a micron.

The embodiment of the invention shown in FIGS. 1—5 has one difficulty in view of the fact that the gate is very narrow. It is very difficult to ground the device without also shorting out both the source and the drain. An embodiment of the invention which overcomes this difficulty is shown in FIGS. 6 and 7.

Figure 6:
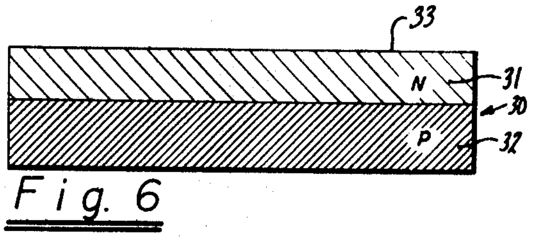
FIGS. 6 and 7 are cross-sectional views showing the processing steps for making a semiconductor structure incorporating another embodiment of the present invention.

As shown in FIG. 6, a semiconductor body 30 is utilized which, in this case consists of first and second layers 31 and 32. The layer 32 carries a P-type impurity. As explained previously, if desired, the layer 32 can be formed of monocrystalline silicon and thereafter all, or only a portion of it doped to provide the desired impurity. The layer 31 is deposited on the body 32 and carries an impurity so that it is of the opposite conductivity type of the semiconductor body 31. The layer 32 is deposited in a conventional manner, such as by epitaxial techniques, and provides a planar surface 33 for the semiconductor body 30.

Figure 7:
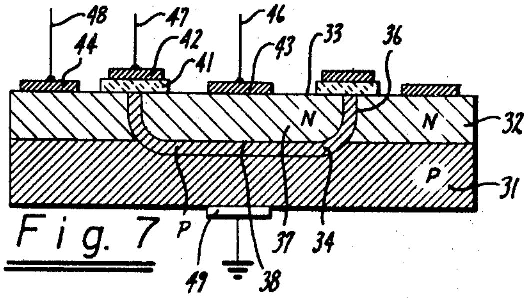

After the epitaxial layer 32 has been deposited, the same steps which are shown in FIGS. 2, 3 and 4 can be accomplished to provide the semiconductor structure which is shown in FIG. 7. Thus, a mask (not shown) is formed on the surface 33 of the epitaxial layer, and thereafter an opening (not shown) is formed so that the silicon dioxide serves as a mask for both diffusion steps in which a first impurity is diffused through the opening which is the same conductivity type as the semiconductor body 31 to provide a region 34 and a dish-shaped junction 36 which extends to the surface 33 and a second impurity to form a region 37 of a conductivity type opposite the conductivity type of region 34 to form another dish-shaped junction 38 within the region 34 and also extending to the surface 33.

In carrying on these two diffusion operations, it is important that the first diffusion operation in which region 34 is formed is sufficiently deep so that it extends through the N-type layer 32 and into the semiconductor body 31 to make contact therewith. Thereafter, the oxide 41 for the gate is formed in the manner similar to that hereinbefore described. Similarly, metallization is provided to obtain the contact pads 42 for the gate 43, for the source and 44 for the drain. Leads 46, 47 and 48 are then provided for the contact pads 42, 43 and 44. An additional contact pad 49 is provided on the underside of the semiconductor body 31 which is grounded. With this construction it can be seen that the narrow P-type region 34 forms a continuous path to the ground contact pad 49 through the P-type semiconductor body 31.

Figure 8:
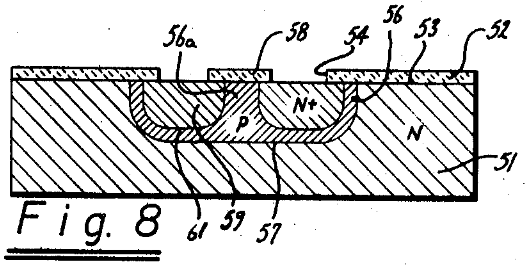
FIG. 8 is a cross-sectional view showing the processing steps for making a semiconductor structure incorporating another embodiment of the present invention.
Figure 9:
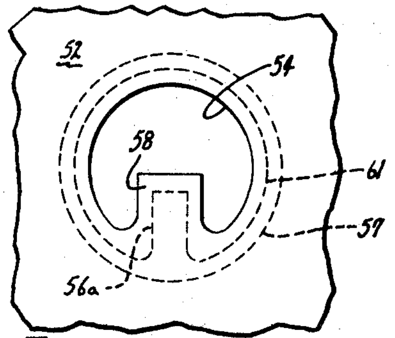
FIG. 9 is a top plan view of the structure shown in FIG. 8.
Figures 5, 10:
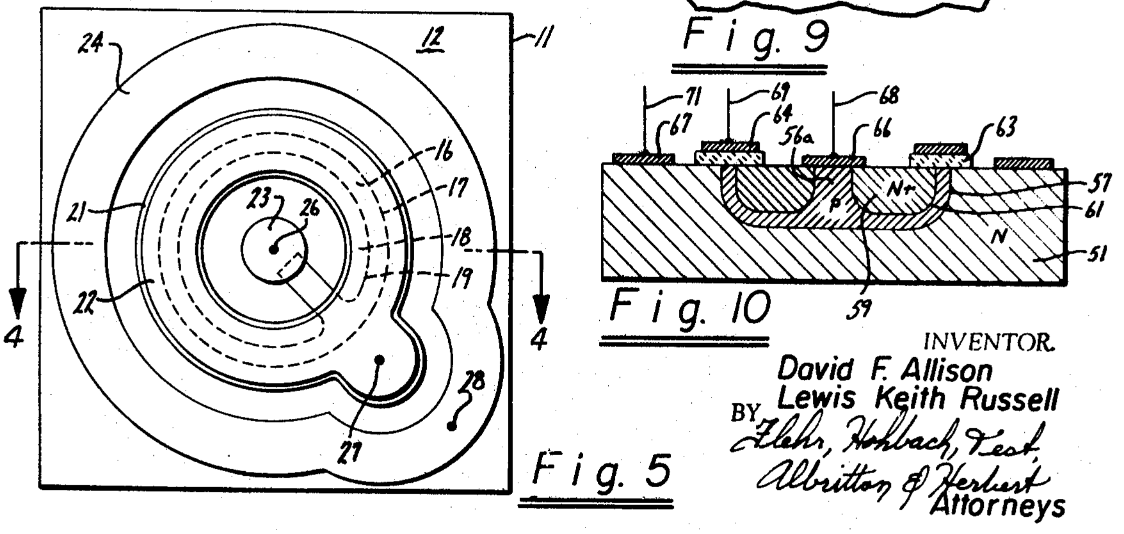
FIG. 5 is a top plan view of a completed semiconductor structure made in accordance with the present invention.
FIG. 10 is a cross-sectional view of the completed semiconductor structure made in accordance with the steps shown in FIGS. 8—10.

Still another embodiment of the invention which makes it possible to ground the substrate to the source is shown in FIGS. 8—10. As shown therein, a semiconductor body 51 containing an N-type impurity is utilized and a silicon dioxide layer 52 is formed on the surface 53 thereof. A single hole 54 is formed in the layer 52 to expose the semiconductor body 51 therebelow. A P-type impurity is thereafter diffused through the opening 54 to provide a region 56 which forms a dish-shaped junction 57 which extends to the surface 53. During the time that the region 56 is being diffused, an effort should be made to keep the formation in the oxide within the hole 54 to a minimum. As soon as the region 56 has been formed, additional oxide is formed in the hole 54 which has a sufficient thickness to prevent an N-type impurity from diffusing through the same as, for example, phosphorus. Photoresist (not shown) is then applied to the oxide which provides a pattern which forms a keylike indenture 58 as shown in FIGS. 8 and 9. Thereafter, by a suitable etch, the relatively thin oxide within the hole 54 is removed leaving the keylike indenture 58 which joins the remaining oxide layer 52 which is sufficiently thick so that it is not all removed during the time that the oxide within the opening 54 is removed. Thereafter, as shown in FIG. 8, the N+ source is diffused through the same hole 54 to provide a region 59 that forms a dish-shaped junction 61 extending to the surface 53 within the region 56. As can be seen from FIGS. 8 and 9, the N+ impurity will be prevented from diffusing completely through the key 58 and, therefore, a portion 56*a* of the P-type region 56 will extend to the surface 53 and has a width which is substantially greater than that of the other portions of the P-type region 56 which form the gate.

As soon as the second diffusion operation has been completed to again provide a gate of a precisely controlled length, all of the oxide is stripped and thereafter, gate oxide 63 is formed in the manner hereinbefore described and metallization is provided to form the gate contact pad 64, the source contact pad 66 and the drain contact pad 67 as shown in FIG. 10. Leads 68, 69 and 71 are provided for making contact to these pads. With this arrangement, it can be seen that the metallization for the source will automatically short out the source and the substrate because the metallization for the contact pad for the source will overlie the key of the gate and at the same time make contact with the region 59.

The embodiment of the invention shown in FIGS. 8—10 has an advantage over the embodiment shown in FIGS. 6 and 7 in that it does not require the use of an epitaxial layer.

It is apparent from the foregoing that there has been provided an improved MOS semiconductor structure in which it is possible to precisely control the channel length by the use of relatively simple fabrication steps.

We claim:

1. In an MOS semiconductor structure, a body formed of a semiconductor material of one conductivity type, said body having a planar surface, a first diffused region of opposite conductivity type formed in said body and extending to said surface and forming a first PN junction in said body which on said surface forms a first continuous line which encloses an area on the surface, a second diffused region in said body of said one conductivity type disposed within said first region and forming a source, said second diffused region forming a second PN junction which extends to the surface, said second PN junction forming a second continuous line on said surface within said first continuous line which encloses an area which is less than the area enclosed by said first continuous line, said second diffused region being formed so that said second continuous line has a general contour with a key which extends out of the general contour, said first and second PN junctions being spaced so that there is provided therebetween a channel region of said opposite conductivity type of precise width which extends to the surface, said channel region including a keylike region that extends into said source and extends to said surface, a layer of insulating material disposed on said surface and overlying said first and second PN junctions and the portions of the channel region extending to the surface, metallization formed on the insulating layer and forming a gate contact, metallization disposed on said surface making contact with the region inside said second diffusion to form a source contact and making contact to the keylike region so that the channel is shorted to the source, and means making contact to said surface in the region outside of said first diffused region to form a drain contact.

2. A semiconductor structure as in claim 1 wherein said keylike portion has a width substantially greater than the width of the remainder of the channel regions.

A-24206

PO-1050
(5/69)

UNITED STATES PATENT OFFICE
CERTIFICATE OF CORRECTION

Patent No. 3,600,642 Dated August 17, 1971

Inventor(s) David F. Allison, Lewis K. Russell

It is certified that error appears in the above-identified patent and that said Letters Patent are hereby corrected as shown below:

Add:

Assignee: SIGNETICS CORPORATION
Sunnyvale, California

Signed and sealed this 23rd day of May 1972.

(SEAL)
Attest:

EDWARD M.FLETCHER,JR.
Attesting Officer

ROBERT GOTTSCHALK
Commissioner of Patents